United States Patent [19]

Saito

[11] Patent Number: 5,248,376

[45] Date of Patent: Sep. 28, 1993

[54] PROCESS FOR THERMAL-ETCHING TREATMENT OF COMPOUND SEMICONDUCTOR SUBSTRATE USED IN MOLECULAR BEAM EPITAXY AND APPARATUS FOR PERFORMING SAME

[75] Inventor: Junji Saito, Isehara, Japan

[73] Assignee: Fujitsu Limited, Kawasaki, Japan

[21] Appl. No.: 831,655

[22] Filed: Feb. 7, 1992

Related U.S. Application Data

[63] Continuation of Ser. No. 511,922, Apr. 16, 1990, abandoned, which is a continuation of Ser. No. 361,767, May 30, 1989, abandoned, which is a continuation of Ser. No. 846,120, Mar. 31, 1986, abandoned.

[30] Foreign Application Priority Data

Apr. 2, 1985 [JP] Japan .................. 60-068460

[51] Int. Cl.$^5$ .................................. C30B 25/00
[52] U.S. Cl. .................. 156/612; 156/611; 156/643; 437/75; 437/167; 437/168; 437/225
[58] Field of Search ............ 156/611, 612, 643; 437/75, 105, 107, 108; 148/DIG. 69, DIG. 22

[56] References Cited

U.S. PATENT DOCUMENTS

| | | | |
|---|---|---|---|
| 3,969,164 | 7/1976 | Cho et al. | 148/DIG. 169 |
| 3,992,233 | 11/1976 | Farrow | 156/612 |
| 4,312,681 | 1/1982 | Rupprecht et al. | 148/1.5 |
| 4,371,968 | 2/1983 | Trussell, Jr. et al. | 437/129 |
| 4,493,142 | 1/1985 | Hwang | 148/1.5 |
| 4,589,192 | 5/1986 | Dinan et al. | 437/81 |
| 4,622,083 | 11/1986 | Shih | 148/DIG. 169 |
| 4,637,129 | 1/1989 | Derkits, Jr. et al. | 437/90 |

FOREIGN PATENT DOCUMENTS 113983 7/1984 European Pat. Off. .

OTHER PUBLICATIONS

Tanaka, "Single Longitudinal-Mode Selfaligned (AlGa) As Double-Heterostructure Lasers Fabricated by MBE", Jpn. J. Appl. Phys. Part 2 vol. 24, No. 2, pp. 89-90 Feb. 85.

Chang, "Molecular Beam Epitaxial Growth of Uniform InGaAs on InP in a coaxial In-Ga Oven", J. of Appl. Physics Feb. 1981, pp. 1015-1020.

Ghandhi "ULSI Fabrication Principles," John Wiley & Sons N.Y., 1983, pp. 58-62 and 330-333.

Cho "Epitaxy of Silicon Doped Gallium Arsemide by Molecular beam Method", Metallurgical Transactions, vol. 2, Mar. 1971, pp. 777-780.

Akira Takamori, et al., *Cleaning of MBE GaAs Substrates by Hydrogen Radical Beam Irradiation*, "Japanese Journal of Applied Physics", Feb. 1987, vol. 26, No. 2, pp. L142-L144.

Journal of the Electrochemical Society, vol. 131, No. 9, Sep. 1984, F. Auret, "Thermal cleaning of InSb surfaces in an ultrahigh vacuum", pp. 2115-2117.

Japanese Journal of Applied Physics. Supplements 16th International Conference Solid State Devices and Materials, Aug. 30–Sep. 1, 1984, N. Matsuo et al.: "Self--cleaning by silicon beam in molecular beam epitaxy", pp. 56–67.

European Search Report, Apr. 6, 1986, Berlin.

Journal of Applied Physics, vol. 45, No. 4, Apr. 1974, pp. 1812-1817, A. Y. Cho and F. K. Reinhart, "Inteface and coping profile characteristics with molecular-beam epitaxy of GaAs: GaAs voltage varactor".

*Primary Examiner*—Robert Kunemund
*Attorney, Agent, or Firm*—Staas & Halsey

[57] ABSTRACT

A process for the thermal-etching treatment of a GaAs substrate subjected to molecular beam epitaxy, which includes: heating the GaAs substrate above a temperature of 750° C., at which temperature both Ga and As are eliminated from the GaAs substrate, while irradiating the GaAs substrate with an As molecular beam. After the heating and irradiating is complete contamination adhering to the GaAs substrate by eliminating a part of the underlying GaAs. The process can be performed by an apparatus which includes a prechamber and a growth chamber for growing an epitaxial layer.

8 Claims, 8 Drawing Sheets

PROCESS FOR THERMAL-ETCHING TREATMENT OF COMPOUND SEMICONDUCTOR SUBSTRATE USED IN MOLECULAR BEAM EPITAXY AND APPARATUS FOR PERFORMING SAME this application is a continuation of application Ser. No. 07/511,922, filed Apr. 16, 1990, now abandoned, which is continuation of copending application(s) Ser. No. 07/361,767 filed on May 19, 1989, now abandoned, which is a continuation of co-pending application Ser. No. 846,120 filed on Mar. 31, 1986 now abandoned.

BACKGROUND OF THE INVENTION

1. Field of the Invention

The present invention relates to a process for carrying out a thermal-etching treatment of a compound semiconductor substrate to be used in molecular beam epitaxy and an apparatus for performing same. More particularly, it relates to a process for the thermal removal of surface carbon or carbide from a GaAs substrate which is subject to a molecular beam epitaxy and an apparatus for performing same.

2. Description of the Related Art

A molecular beam epitaxy (MBE) technique for compound semiconductors such as GaAs is often used for the fabrication of high speed devices such as high electron mobility transistors (HEMT), and it is well known that a carrier depletion layer is formed around the interrupted growth interface and the substrate-epitaxial interface as a result of this technique. Such a depletion layer will sometimes degrade the performance of the devices.

Therefore, the cleaning process of the substrate in the MBE chamber prior to the epitaxial growth process is very important to an improvement of the quality of the epitaxial films. The major contaminants formed GaAs on the GaAs substrate after chemical etching and loading into an MBE chamber are oxygen and carbon in the form of carbon dioxide ($CO_2$) or carbon hydride ($C_nH_{2n+1}$) etc., (cf: Interface and doping profile characteristics with molecular-beam epitaxy of GaAs:GaAs voltage character, J. Appl. Phys. 45(4) April, 1974). Oxygen can be thermally removed by heating the substrates to ~530° C. However, this heating process is not enough to eliminate other forms of contamination, especially carbon or carbide, from the GaAs substrate. The conventional treatment ~530° C. Further, when a semiconductor crystalline layer is epitaxially formed on a surface of a GaAs substrate in a state wherein carbon atoms, etc.,are adhered thereto, the carbon atoms, etc., act as acceptors so that an interfacial layer between the GaAs substrate and the semiconductor crystalline layer is formed. In order to negate the effect of the formation of the interfacial layer, the formation of a thick buffer layer is necessary. This takes a lot of time and thus the production output time is decreased.

SUMMARY OF THE INVENTION

It is an object of the present invention to provide a process for the thermal-etching treatment of a semiconductor substrate used in molecular beam epitaxy wherein carbon is thermally removed and the surface defect density between the substrate and an epitaxial layer is removed.

It is another object of the present invention to provide the above-mentioned process for thermal etching whereby a thin buffer layer, on which is formed a semiconductor crystalline layer having good properties and less defect, is formed on a semiconductor substrate so that the production output of the semiconductor device can be increased.

It is further object of the present invention to provide an apparatus for performing the above-mentioned process.

According to the present invention there is provided a process for the thermal-etching of a GaAs substrate used in molecular beam epitaxy comprising the steps of: heating the GaAs substrate above a temperature of 750° C., at which temperature both Ga and As are eliminated from the surface of the GaAs substrate, while irradiating the GaAs substrate with an As molecular beam; and removing carbon adhering to the surface of the GaAs substrate by eliminating a portion of the underlying GaAs.

Further, according to the present invention there is provided a process for the thermal-etching of a compound semiconductor substrate used in molecular beam epitaxy comprising the steps of: heating the compound semiconductor substrate above a temperature at which all elements of the compound semiconductor are eliminated from the surface of the compound semiconductor substrate, while irradiating the compound semiconductor with an As molecular beam; and removing carbon adhering to the surface of the compound, semiconductor substrate by eliminating a portion of the underlying compound semiconductor.

Still further, according to the present invention there is provided an apparatus for performing a process for thermal-etching treatment of a compound semiconductor substrate used in molecular beam epitaxy comprising: a prechamber for preparing a compound semiconductor substrate; a holder for holding the compound semiconductor substrate and heating same above a temperature at which both Ga and As are eliminated from the compound semiconductor surface, and a molecular beam source which irradiates the compound semiconductor substrate with the molecular beam of the element; and a growth chamber in which a semiconductor crystalline layer is epitaxially grown, the growth chamber being a continuation of the prechamber.

BRIEF DESCRIPTION OF THE DRAWINGS

The other objects and features of the present invention will be understood from the ensuing description of the preferred embodiment of the present invention with reference to to drawings in which.

DESCRIPTION OF THE PREFERRED EMBODIMENTS

In order to find the dependence of the thermal etching rate of a GaAs substrate under the arsenium pressure, the present inventor experimented as follows.

A (100)GaAs substrate was degreased in trichloroethylene, and rinsed in sequence with methanol and deionized water. The substrate was then chemically etched in $H_2SO_4:H_2O:H_2O_2$, rinsed with deionized water, dried with dry nitrogen gas, and mounted on a molybdenum (Mo) block using solder. The thermal etching was performed in a growth chamber at substrate temperature of 720° C., 750° C., and 780° C. with an $As_4$ pressure of $1.5 \times 10^{-5}$ Torr. The substrate temperature was measured by a calibrated infrared pyrometer.

Figure 1:
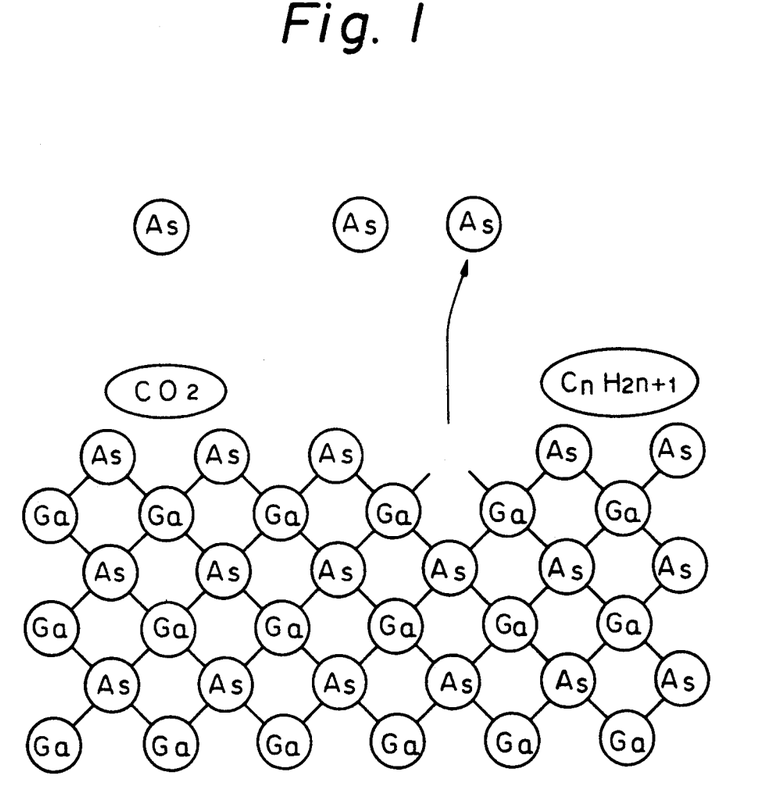
FIG. 1 is a schematic diagram showing the elimination of an As element from the surface of a GaAs compound.
Figure 2:
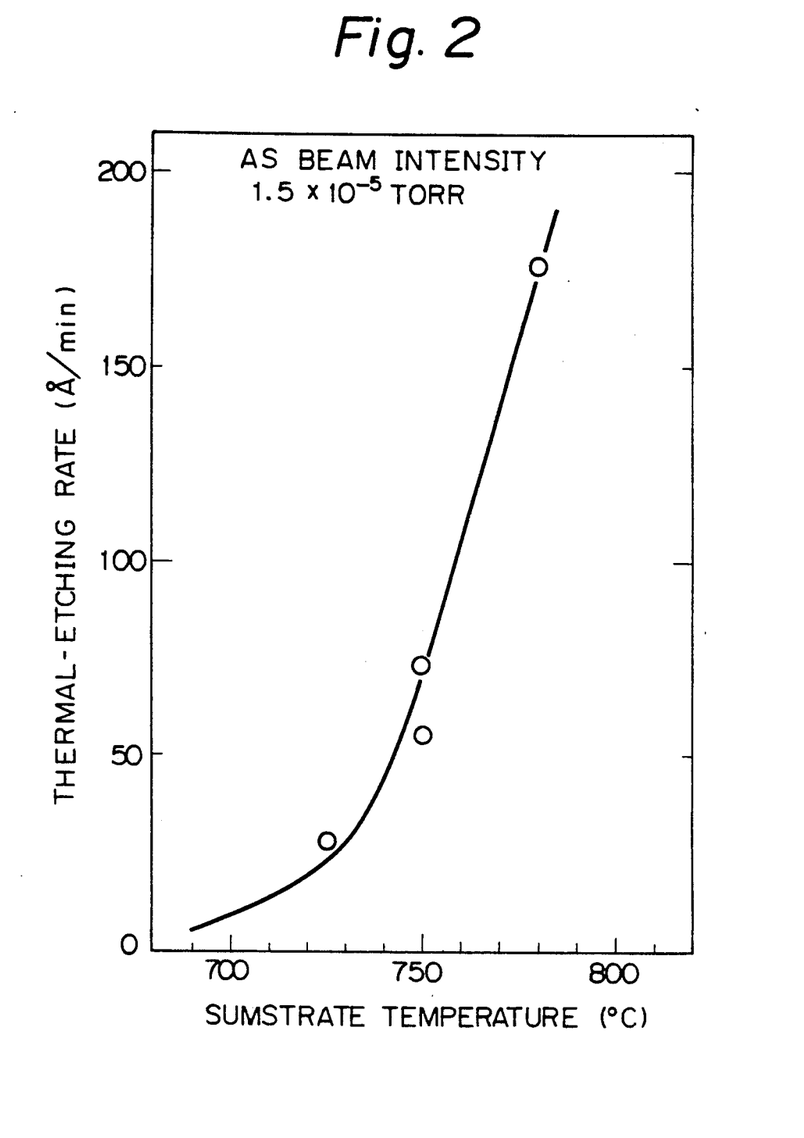
FIG. 2 is graph showing the dependence of the thermal etching rate on the substrate temperature at an $As_4$ pressure.

As shown in FIG. 2, the etching rates were remarkably increased in accordance with the substrate temperature; i.e., approximately 20Å/min at 720° C., 60Å/min at 750° C., and 180Å/min at 780° C., with an $As_4$ pressure of $1.5 \times 10^{-5}$ Torr. It can be seen that the etching rate remarkably increases at a temperature above 750° C. The inventor also found that the increment of the etching rate as a function of the temperature is almost the same as the vapour pressure of the Ga.

Figure 3:
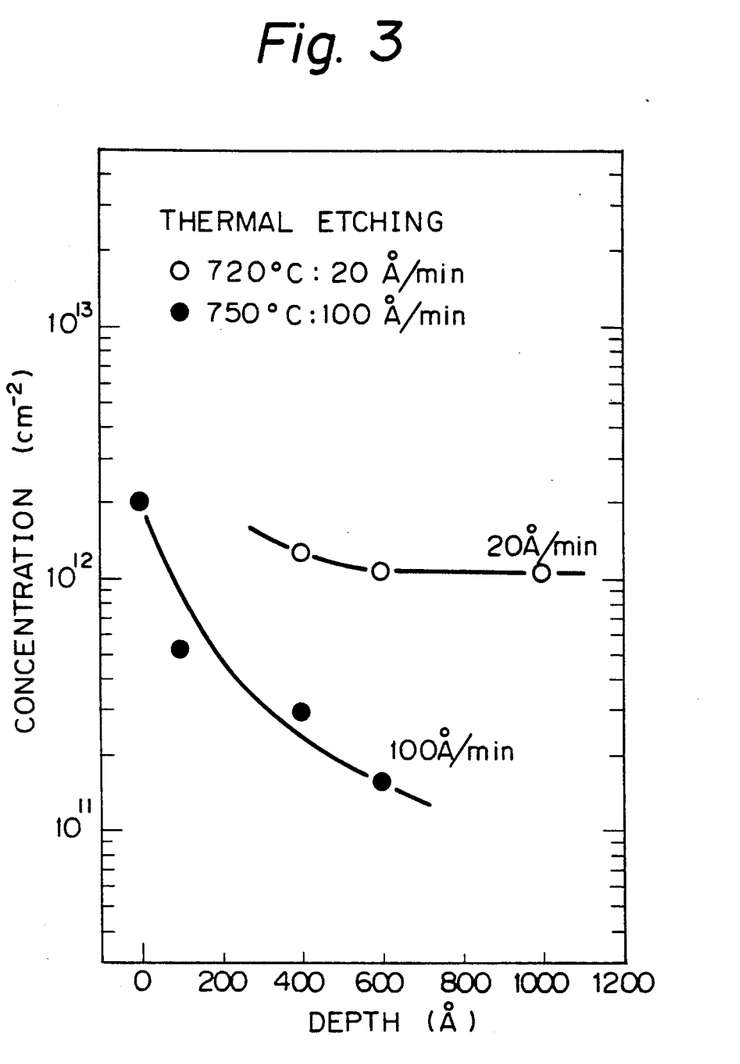
FIG. 3 is a graph showing the dependence of the amount of the carrier depletion on the etching depth.

The present inventor then studied the dependence of the carrier depletion on the etching depth. An Si doped n-GaAs layer was grown on an Si doped GaAs substrate at a rate of 1 $\mu$m/h at a substrate temperature of 640° C. The doping levels of the epitaxial layer and the substrate were $8 \times 10^{16}$ cm$^{-3}$. The thickness of the epitaxial layer was approximately 1 $\mu$m. The depth of etching was varied from 0 °A to 1000 °A by changing the etching time at the temperatures of 720° C. and 750° C. The dependence of the carrier depletion on the etching depth is shown in FIG. 3. By removing at least 150Å of the substrate there is a substantial decrease in carbon concentration as shown in FIG. 3.

The possible sources of the origin of the carrier depletion are the trap formation and the carrier compensation caused by the As evaporation loss and/or the contamination on the initial substrate surface. A DLTS measurement was performed to detect deep trap levels near the thermally etched and non-etched interfaces. The total concentration of the trap levels of non-etched interfaces obtained was less than $1 \times cm^{-2}$, which is much less than the amount of the carrier depletion $10^{12}$ cm$^{-2}$). Therefore, the deep traps were found not to be the origin of the carrier depletion at the interface.

Figure 4:
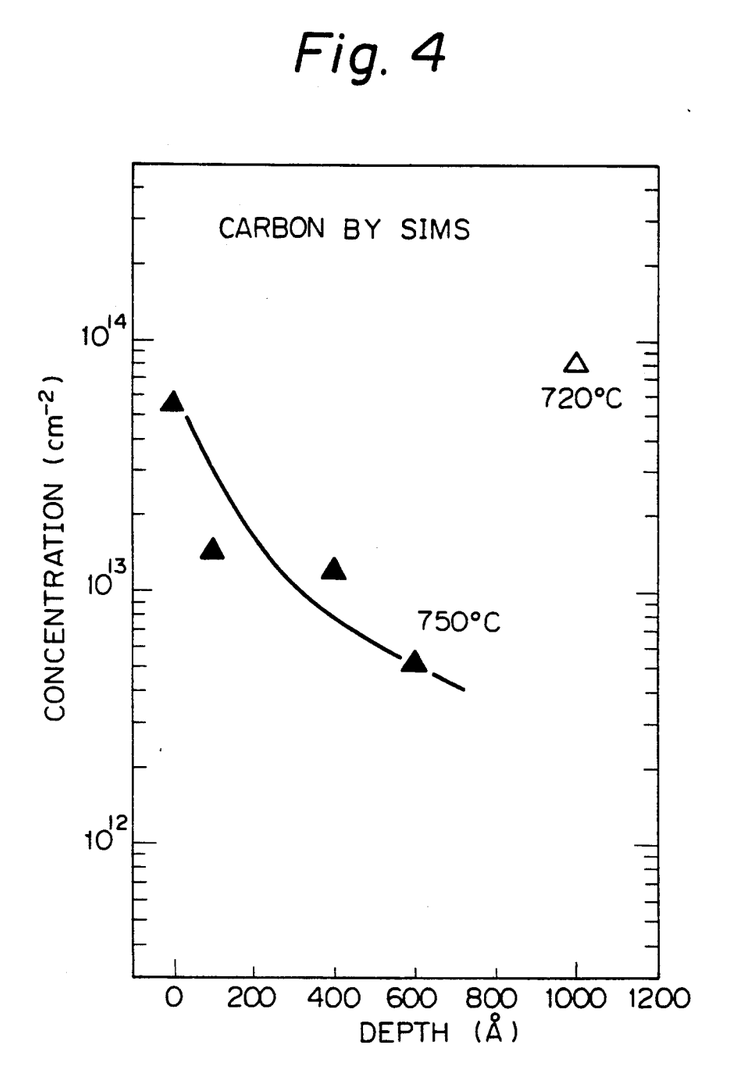
FIG. 4 is a graph showing the dependence of the carbon concentration on the etching depth as a result of performed etching at 720° C. and 750° C.
Figure 5:
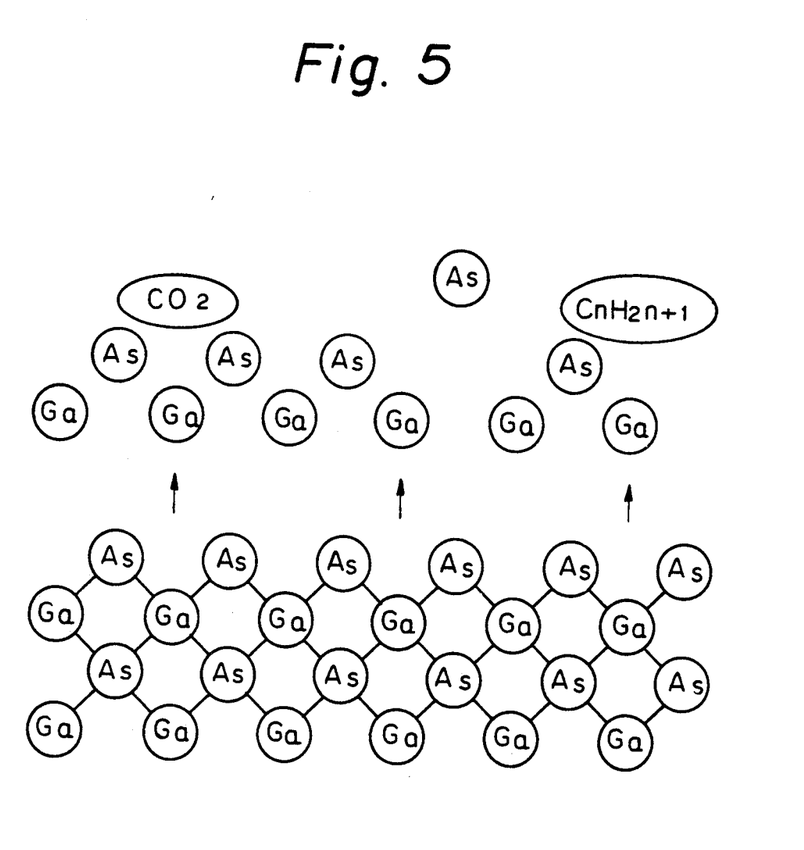
FIG. 5 is a schematic diagram showing the elimination of carbon by eliminating a part of the GaAs surface.

Next the concentration of the remaining carbon at the substrate-epitaxial layer was detected by performing a SIMS measurement using Cs+ bombardment. FIG. 4 show the dependence of the carbon concentration on the depth of the thermal etching at 720° C. and 750° C. The concentration of the carbon at the interface without thermal etching was $5.5 \times 10^{13}$ cm$^{-2}$. The carbon concentration was reduced to about $0.5_{NO}^{13}$cm$^{-2}$ by etching at least 150Å and to $5.3 \times 10^{12}$ cm$^{-2}$ by etching at 750° C. to a depth of about 600Å. On the other hand, the concentration of the carbon contamination did not depend on the etching depth in the case of a low etching temperature of 720° C. Even though the substrate was etched to 1,000Å at a temperature of 720° C., the amount of remaining carbon atoms was $8.3 \times 10^{13}$ cm$^{-2}$. The above results show that there is a good correspondence between the concentration of the carbon contamination detected by the SIMS measurement (shown in FIG. 4) and the amount of the carrier depletion measured by the C-V technique (shown in FIG. 3). Therefore, the carbon contamination remaining on the substrate is considered to be the main cause of the formation of the carrier depletion. The carbon is present even though the substrate is carefully etched with H etchant and rinsed with deionized water. Since carbon is a shallow acceptor in GaAs, it will compensate donors. When a GaAs substrate is thermally etched above 750° C., carbon ($CO_2$, $C_nH_{2n+1}$, etc.) contamination on the substrate surface may be removed by evaporating Ga and/or GaAs molecules, as shown in FIG. 5. This thermal etching technique was used in the cleaning of the GaAs substrate in the growth of selectively doped (SD) GaAs/N-$Al_{0.3}Ga_{0.7}$As heterostructures of FIG. 7 by using the apparatus shown in FIG. 6.

Figure 6:
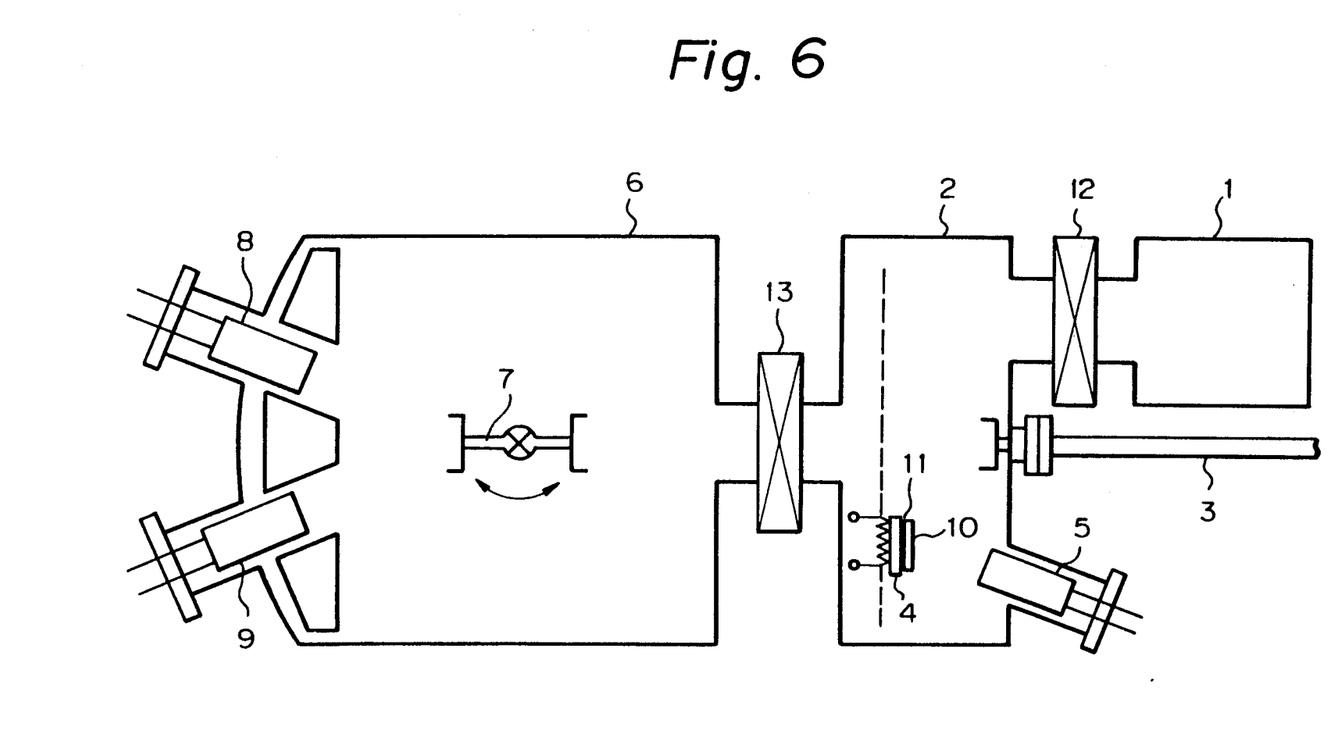
FIG. 6 is a diagram of an apparatus according to the present invention.

In FIG. 6, a GaAs substrate 10 adhered coupled to a molybdenum (Mo) block (not shown) by an Indium (in)) solder is introduced into a substrate exchanging chamber 1. Then, the chamber 1 is evacuated to $10^{-7}$ to $10^{-8}$ Torr and a gate valve 12 is opened. The GaAs substrate 10 is then moved to a prechamber 2, for preparing the substrate, maintained at a pressure of approximately $2 \times 10^{-9}$ Torr and provided with an As molecular beam source 5. When the As molecular beam is irradiated the evacuated pressure in the prechamber 2 is lowered to $10^{-7}$ Torr The GaAs substrate 10 on a substrate holder 4, which can be heated, is heated at approximately 750° C. for about 3 minutes while the As molecular beam is irradiated, in which the As pressure is $1.5 \times 10^{-5}$ Torr, and subsequently, the temperature is lowered at a rate of 20° C./min to about 300° C. so that the GaAs substrate 10 can be moved to a growth chamber 6.

The reason for the As molecular beam irradiation is to compensate for the eliminated arsenic atoms caused by the heat treatment of 750° C. or more.

In the growth chamber 6, a GaAs/AlGaAs semiconductor epitaxial layer is grown on the GaAs substrate 10 at about 680° C. Reference numerals 7, 8 and 9 denote a substrate holder, an As molecular beam source, and a Ga molecular beam source, respectively.

Figure 7:
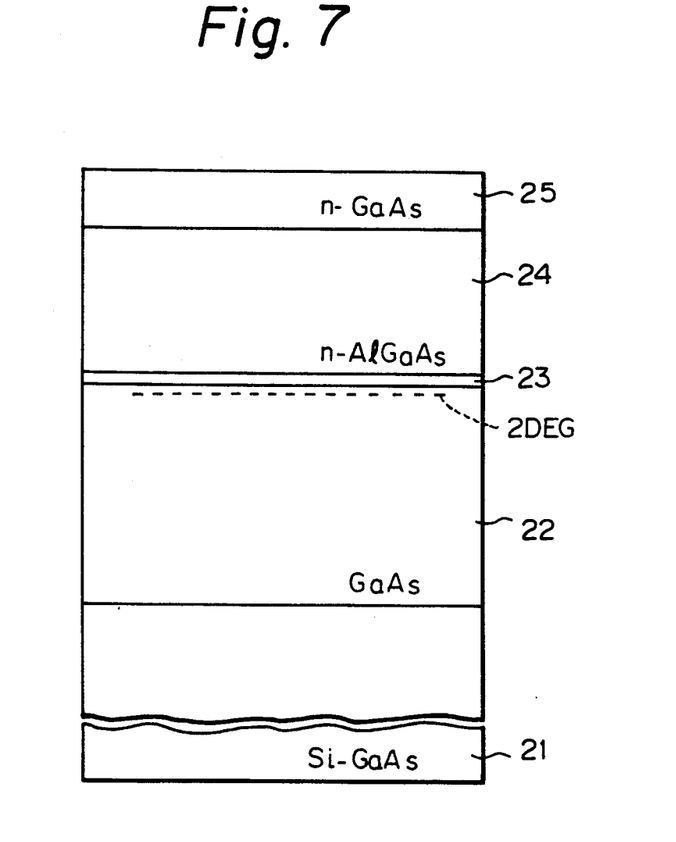
FIG. 7 is a cross-sectional view of a wafer produced by a process according to the present invention.

FIG. 7 shows a cross-sectional view of a wafer produced by a process according to the present invention.

As shown in FIG. 7, a 0.3 $\mu$m thick GaAs buffer layer 22 is formed on a semi-insulating GaAs substrate 21. Then, a 60Å thick $Al_{0.3}Ga_{0.7}$As spacer layer 23 is formed on the GaAs buffer layer 22, and subsequently, a 900Å Si doped ($1 \times 10^{18}$ cm$^{-3}$) n - type $Al_{0.3}Ga_{0.7}$As electron carrier layer 24 and a 200Å Si-doped ($1 \times 10^{18}$ cm$^{-3}$) n-type GaAs electrode contact layer 25 are formed on the spacer layer 23.

In another embodiment of the thermal etching process according to the present invention, the GaAs substrate 10 is heated at 780° C. for about 1.5 minutes under $1.5 \times 10^{-5}$ Torr As pressure. Further, in another embodiment the GaAs substrate 10 is heated at 770° C. for about 9 minutes under $5 \times 10^{-5}$ Torr As pressure.

Figure 8:
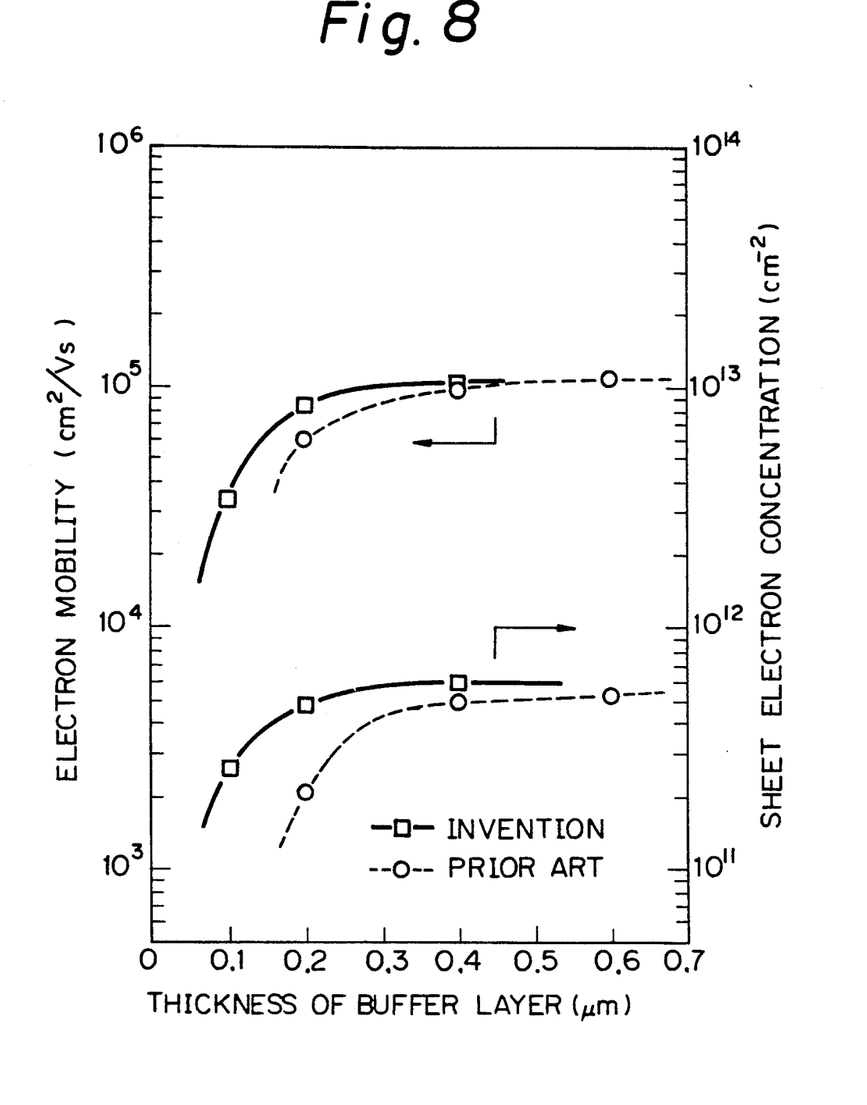
FIG. 8 is a graph showing the mobility and sheet concentration of a two dimensional electron gas (2DEG) as a function of the thickness of the GaAs buffer layer.

FIG. 8 is a graph showing the mobility ($\mu$) and sheet concentration ($n_s$) of two dimensional electron gas (2 DEG) obtained by Hall measurements at 77k as a function of the thickness of the GaAs buffer layer. The two dimensional electron gas (2 DEG) is generated at the interface between the GaAs buffer layer 22 and the AlGaAs spacer layer 23. Moreover, the mobility ($\mu$) and the sheet concentration ($n_s$) of 2 DEG of the sample grown on a non-etched substrate provided with a 0.6 $\mu$m GaAs buffer layer produced by a conventional process is also shown in FIG. 8 (open circles). As the thickness of the GaAs buffer layer decreased to less than 0.1 $\mu$m, the quality of the 2 DEG became extremely degraded for the thermally etched (present invention) and the non-etched (conventional process) substrate. For a buffer layer in the range of from 0.1 $\mu$m to 0.4 $\mu$m, however, it is clear that the thermal etching of the substrate improves the quality of the 2 DEG in SD heterostructures. The mobility and the sheet concentration of the 2 DEG with the GaAs buffer layer having a thickness of 0.2 $\mu$m, grown on the thermally etched substrate according to the present invention were 90,000 cm$^2$Vs and $5.0\times 10^{11}$ cm$^{-2}$ respectively at 77k. On the other hand, the values of the mobility and sheet concentration of the 2 DEG grown on the non-etched substrate according to a conventional process were approximately 60,000 cm$^2$/Vs and $4.0\times 10^{11}$ cm$^{-2}$, respectively, at 77k. The main cause of the reduction of the 2 DEG with the thin buffer layer from 0.1 to 0.4 $\mu$m may be the carrier depletion at the substrate-epitaxial interface. The main cause of the carrier depletion is considered to be the carbon ($CO_2$, $C_nH_{2n+1}$) contamination existing on the initial growth surface. Thus it is considered that the thermal etching process according to the present invention causes a large improvement in the quality of the 2 DEG in SD GaAs/N - Al$_{0.3}$Ga$_{0.7}$As heterostructures with a very thin GaAs buffer layer (0.2 $\mu$m).

In the present invention, a GaAs substrate was used as an example. However, another compound semiconductor substrate such as III-V group semiconductor (InP, InSb etc.) substrate also may be used.

What is claimed is:

1. A process for thermal-etching a GaAs substrate including a contamination layer, comprising the steps of:

heating the GaAs substrate to a temperature higher than 750° C. so as to evaporate both As and Ga from the substrate constituent materials, remove a portion of the GaAs substrate having a thickness in the rang of from approximately 150Å to approximately 700Å, and reduce the concentration of carbon in said contamination layer to less than $5.5\times 10^{13}$ cm$^{-2}$; and simultaneously irradiating the surface of the GaAs substrate with an As molecular beam.

2. A process according to claim 1, wherein said heating step includes irradiating an As molecular beam at an As pressure of $1.5\times 10^{-5}$ Torr.

3. A process according to claim , wherein the contamination layer includes carbon dioxide or carbon hydride.

4. A method for processing a GaAs substrate including a contamination layer, comprising the steps of:

heating the GaAs substrate to a temperature higher than 750° C. so as to evaporate both As and Ga from the substrate constituent materials, remove a portion of the GaAs substrate having a thickness in the range of from approximately 150Å to approximately 700Å, and reduce the concentration of carbon in said contamination layer to less than $5.5\times 10^{-}$cm$^{-2}$;

simultaneously irradiating the surface of the GaAs substrate with an As molecular beam; and then forming a thin GaAs buffer layer on the contamination-removed GaAs substrate.

5. A process for thermal-etching a compound semiconductor substrate used in molecular beam epitaxy, said substrate including a contamination layer, said process comprising the step of:

heating the compound semiconductor substrate to a temperature sufficiently high so as to eliminate all elements of the compound semiconductor constituent materials form the surface of the compounds semiconductor substrate, remove a portion of the compound semiconductor substrate having a thickness in the range of from approximately 150Å to approximately 700Å, and reduce the concentration of carbon in said contaminating layer to less than $5.5\times 10^{13}$ cm$^{-2}$; and simultaneously irradiating the compound semiconductor with an As molecular beam.

6. A process for thermal-etching a group III-V substrate including a contamination layer, comprising the steps of:

heating the group III-V substrate to a temperature higher than 750° C. so as to evaporate group III-V elements from the substrate constituent materials, remove a portion of the group III-V substrate having a thickness in the range of from approximately 150Å to approximately 700Å, and reduce the concentration of carbon in said contamination layer to less than $5.5\times 10^{13}$ cm$^{-2}$; and simultaneously irradiating the surface of the group III-V substrate with a molecular beam.

7. A process according to claim 6, wherein said group III-V substrate is a GaAs substrate.

8. A process according to claim 6, wherein the molecular beam is an As molecular beam.

* * * * *

UNITED STATES PATENT AND TRADEMARK OFFICE
CERTIFICATE OF CORRECTION

PATENT NO. : 5,248,376
DATED : September 28, 1993
INVENTOR(S) : JUNJI SAITO

It is certified that error appears in the above-indentified patent and that said Letters Patent is hereby corrected as shown below:

Column 1, line 40 insert --,-- after "oxygen".

Column 2, line 3, "defect" should be --defects--;

line 51, "to to" should be --to the--;

line 62, "performed etching" should be --etching performed--.

Column 3, line 18, "temperature" should be --temperatures--;

line 55, insert --,-- after "Next".

Column 4, line 21, delete "adhered";

line 23, "(in))" should be --(In)--.

Column 5, line 18, insert --,-- after "respectively".

Signed and Sealed this

Twenty-first Day of June, 1994

BRUCE LEHMAN

*Attest:*

*Attesting Officer*   *Commissioner of Patents and Trademarks*